United States Patent
Uhlemann et al.

(10) Patent No.: US 10,578,685 B2
(45) Date of Patent: Mar. 3, 2020

(54) RADIATION-TRANSPARENT, LOW-COST, LIGHTWEIGHT, VERSATILE, COMPOSITE RADIO FREQUENCY COIL FOR MRI

(71) Applicant: KONINKLIJKE PHILIPS N.V., Eindhoven (NL)

(72) Inventors: Falk Uhlemann, Eindhoven (NL); Oliver Lips, Eindhoven (NL)

(73) Assignee: Koninklijke Philips N.V., Eindhoven (NL)

(*) Notice: Subject to any disclaimer, the term of this patent is extended or adjusted under 35 U.S.C. 154(b) by 223 days.

(21) Appl. No.: 15/547,103

(22) PCT Filed: Jan. 21, 2016

(86) PCT No.: PCT/EP2016/051188
§ 371 (c)(1),
(2) Date: Jul. 28, 2017

(87) PCT Pub. No.: WO2016/124406
PCT Pub. Date: Aug. 11, 2016

(65) Prior Publication Data
US 2018/0017642 A1   Jan. 18, 2018

(30) Foreign Application Priority Data

Feb. 3, 2015 (EP) .................................... 15153637

(51) Int. Cl.
*G01R 33/34* (2006.01)
*G01R 33/48* (2006.01)
(52) U.S. Cl.
CPC . *G01R 33/34007* (2013.01); *G01R 33/34046* (2013.01); *G01R 33/481* (2013.01)
(58) Field of Classification Search
CPC .. A61B 5/055; G01R 33/28; G01R 33/34007; G01R 33/34023; G01R 33/3403;
(Continued)

(56) References Cited

U.S. PATENT DOCUMENTS 5,053,711 A   10/1991   Hayes et al.
5,594,339 A   1/1997   Henderson et al.
(Continued)

FOREIGN PATENT DOCUMENTS

CN   201398968 Y   2/2010
JP   2002085378 A   3/2002

*Primary Examiner* — Steven L Yeninas

(57) ABSTRACT

A radio frequency coil (34), for use in a medical modality including at least a magnetic resonance examination system (10), comprises: a right hollow cylinder-shaped patient bore lining (36), an inner carrier member (40) that is fixedly attached to an outwardly directed surface of the patient bore lining (36), a radio frequency antenna (42), fixedly attached to an antenna carrier member (44) made from a composite material, which in turn is fixedly attached to an outwardly directed surface of the inner carrier member (40), at least one outer carrier spacer member (48), arranged on at least one out of the at least one radio frequency antenna (42) or an outwardly directed surface of the antenna carrier member (44), and providing a free end-to-end space (50) in a direction parallel to the center axis (38) of the patient bore lining (36), a right hollow cylinder-shaped outer carrier member (52) with a center axis (54), which in an operational state is arranged in parallel to the center axis (38) of the patient bore lining (36), and is in mechanical contact with outwardly directed surfaces of the outer carrier spacer members (48), and a shell member (58) that is in mechanical contact with an outwardly directed surface of the outer carrier member (52); and a medical modality including at least a magnetic resonance examination system (10) with such radio frequency coil (34).

20 Claims, 2 Drawing Sheets

(58) Field of Classification Search
CPC ........ G01R 33/34046; G01R 33/34076; G01R 33/3415; G01R 33/3685; G01R 33/385; G01R 33/3854; G01R 33/3856; G01R 33/3858; G01R 33/422; G01R 33/481; G01R 33/34; G01R 33/365
USPC .................................................. 324/318, 322
See application file for complete search history.

(56) References Cited

U.S. PATENT DOCUMENTS

| | | | |
|---|---|---|---|
| 7,719,277 B2 | 5/2010 | Eberler et al. | |
| 8,108,026 B2 | 1/2012 | Eberler et al. | |
| 8,779,773 B2* | 7/2014 | de Lima | G01R 33/34007 324/318 |
| 8,786,283 B2 | 7/2014 | Gross et al. | |
| 2007/0210797 A1* | 9/2007 | Bittner | A61B 5/0555 324/318 |
| 2008/0180101 A1 | 7/2008 | Bradshaw et al. | |
| 2008/0267478 A1* | 10/2008 | Eberler | G01R 33/34046 382/131 |
| 2008/0272786 A1* | 11/2008 | Luedeke | G01R 33/34 324/322 |
| 2009/0076376 A1* | 3/2009 | Atkins | G01R 33/34 600/421 |
| 2012/0062232 A1 | 3/2012 | Matschl et al. | |
| 2013/0193974 A1* | 8/2013 | McBroom | G01R 33/34076 324/322 |
| 2013/0293232 A1 | 11/2013 | Boskamp et al. | |
| 2013/0338488 A1* | 12/2013 | Dietz | A61B 5/0555 600/415 |
| 2014/0194727 A1 | 7/2014 | Boskamp | |
| 2015/0043068 A1* | 2/2015 | Dotzel | G01R 33/28 359/463 |
| 2015/0102813 A1* | 4/2015 | Dumoulin | G01R 33/34 324/322 |
| 2015/0253401 A1* | 9/2015 | Rapoport | A61B 5/055 324/318 |

* cited by examiner

RADIATION-TRANSPARENT, LOW-COST, LIGHTWEIGHT, VERSATILE, COMPOSITE RADIO FREQUENCY COIL FOR MRI

CROSS REFERENCE TO RELATED APPLICATIONS

This application is a U.S. national phase application of International Application No. PCT/EP2016/051188, filed on Jan. 21, 2016, which claims the benefit of EP Application Serial No. 15153637.2 filed on Feb. 3, 2015 and is incorporated herein by reference.

FIELD OF THE INVENTION

The invention pertains to a radio frequency coil for use in a medical modality that includes at least a magnetic resonance examination system, and a medical modality comprising at least a magnetic resonance examination system with such radio frequency coil.

BACKGROUND OF THE INVENTION

In the field of medical examination modalities, it is known to combine the imaging method of magnetic resonance (MR) tomography and another examination or therapeutic method in one examination modality.

For example, U.S. Pat. No. 8,108,026 B2 describes a device including a combination of a magnetic resonance tomograph and a positron emission tomograph. A magnetic resonance (MR) radio frequency (RF) transmit-receive system of the MR tomograph and positron emission tomography (PET) detectors of the PET tomograph are arranged inside a primary magnet and a magnetic resonance gradient coils of the MR tomograph.

The device further comprises a support tube for the MR RF transmit-receive system. The support tube includes a sandwich structure that has an outer wall and an inner wall which are made of thin layers with high rigidity, respectively, and may be made from, for instance, glass fiber-reinforced epoxy resin. The sandwich structure further includes a central layer made of a material configured to resist an applied pressure, for instance a foam material such as polyurethane foam or a honeycomb-type material.

The device is described to obviate an attenuation of gamma radiation due to the support structures arranged inside a PET ring and to permit simultaneous PET and MR imaging and therefore faster scanning of a patient.

SUMMARY OF THE INVENTION

It is desirable to make available a radio frequency coil for use in a medical modality including a magnetic resonance examination system, that can easily be manufactured from standard materials and that suffices requirements regarding weight, mechanical stability and cost, and, if applicable, radiation transparency.

It is therefore an object of the invention to provide a radio frequency coil for use in a medical modality that includes at least a magnetic resonance examination system, and that is configured for being arranged within an examination space of the magnetic resonance examination system, wherein a main magnet is configured for generating a static magnetic field $B_0$ at least within the examination space.

The radio frequency coil comprises
a patient bore lining having the shape of a right hollow cylinder with a center axis,
an inner carrier member that is in mechanical contact with at least a major part of an outwardly directed surface of the patient bore lining and is fixedly attached to the patient bore lining, and
at least one radio frequency antenna that is fixedly attached to an antenna carrier member, wherein the antenna carrier member is made from a composite material and is fixedly attached to an outwardly directed surface of the inner carrier member.

The phrase "radio frequency coil", as used in this application, shall in particular be understood as a device that is configured for at least applying radio frequency power to nuclei of or within at least a body portion of a subject of interest for magnetic resonance excitation purposes, wherein at least the body portion of the subject of interest is arranged within a volume surrounded by the radio frequency coil. In particular, the phrase "radio frequency coil" shall encompass whole-body coils, head coils and coil bridges.

The phrase "right cylinder", as used in this application, shall in particular be understood as any ruled surface spanned by a one-parameter family of parallel lines that are arranged perpendicular to a closed base line of the cylinder lying in a plane, and shall in particular encompass elliptical and circular right cylinders as well as prisms having a polygonal cross-section.

The phrase "in parallel", as used in this application, shall in particular be understood to encompass any directions that form an acute angle with the one direction that is exactly parallel to the center axis within an angular range of 10° to both sides of the one direction.

The phrase "center axis" of a right cylinder, as used in this application, shall in particular be understood as a line that is arranged in parallel to the one-parameter family of parallel lines and through a geometric center of the closed base line of the cylinder.

The phrase "outwardly directed", as used in this application, shall in particular be understood as directing away from the center axis. More specifically, a normal emerging from the surface has, with regard to the center axis, a non-zero radial component pointing in the direction of increasing radial distances to the center axis.

The radio frequency coil further includes:
at least one outer carrier spacer member that is arranged on at least one out of the at least one radio frequency antenna or an outwardly directed surface of the antenna carrier member, wherein the at least one outer carrier spacer member provides a free end-to-end space in a direction parallel to the center axis,
an outer carrier member shaped as a right hollow cylinder having a center axis, which in an operational state is arranged in parallel to the center axis of the patient bore lining center axis, that is in mechanical contact with at least a major part of a total area of outwardly directed surfaces of the outer carrier spacer members, and
a shell member that is in mechanical contact with at least a major part of an outwardly directed surface of the outer carrier member.

The phrase "at least a major part", as used in this application, shall in particular be understood as any percentage between, and including, 30% and 100%.

One advantage of the invention lies in that a radio frequency coil can be manufactured from standard materials that meets stability requirements and is nevertheless lightweight and cost-efficient. Thereby, the invention is based on the concept to establish the required stability not by a single component alone but by the shear-force distribution generated in the layered structure of several components. Due to its light weight, the radio frequency coil may beneficially be handled by a single service technician.

Another advantage lies in that the radio frequency coil can be designed to have a low inherent attenuation for radiation, for instance γ-radiation, which is beneficial for medical modalities comprising a combination of a magnetic resonance examination system and a radiation-based medical examination or therapy modality, for instance a PET system.

Yet another advantage of the invention lies in that due to the layered structure and a thereby created safety distance to the patient, the radio frequency coil can easily be designed to inherently comply with specific absorption rate (SAR) limits arising from safety regulations and standards.

Furthermore, the radio frequency coil design inherently comprises free space for taking up electronic components required for operating the at least one radio frequency antenna and for keeping them at locations that are close to the at least one radio frequency antenna.

In another preferred embodiment of the radio frequency coil, each one of the inner carrier member, the plurality of outer carrier spacer members and the outer carrier member has a uniform thickness in a radial direction with regard to the center axis of the patient bore lining. The uniform thicknesses of the inner carrier member, the plurality of outer carrier spacer members and the outer carrier member may be different from each other.

In this way, a uniform distribution of mechanical forces can be accomplished and a necessity for mechanical reinforcement of radio frequency coil components at locations of increased stress or strain can be obviated, resulting in a particularly low weight.

In yet another preferred embodiment of the radio frequency coil, in the operational state at least the center axis of the patient bore lining and the center axis of the outer carrier member coincide.

In this way, an advantageously compact design for the radio frequency coil can be accomplished.

Preferably, the center axis of the patient bore lining and the center axis of the outer carrier member coincide with a horizontal axis being arranged in parallel the center axis of the patient bore lining and passing through the magnetic isocenter of the main magnet of the magnetic resonance examination system, wherein the magnetic isocenter is the center point of a magnetic field generated by the main magnet.

In one embodiment, the radio frequency coil further comprises a radio frequency screen that is fixedly attached to the shell member which serves as a carrier. In this way, the radio frequency coil can be designed in an especially compact way.

In one embodiment, the radio frequency coil comprises a plurality of outer carrier spacer members, wherein at least two of the outer carrier spacer members are spaced in an azimuthal direction about the center axis of the patient bore lining to provide the free end-to-end space. A close-by keeping of electronic components can readily be facilitated thereby. Furthermore, air ducts can be provided for enabling a controlled flow of cooling air flow through the radio frequency coil.

Preferably, each outer carrier spacer member of the plurality of outer carrier spacer members is disposed in such a way that a direction of largest extension is arranged in parallel to the center axis of the patient bore lining. The phrase "in parallel", as used in this application, shall in particular be understood to encompass any directions that form an acute angle with the one direction that is exactly parallel to the center axis of the patient bore lining within an angular range of 10° to both sides of the one direction. In this way, an even distribution of mechanical forces among the plurality of outer carrier spacer members can be achieved.

In one preferred embodiment, the outer carrier spacer members of the plurality of outer carrier spacer members are regularly spaced in the azimuthal direction. By that, a particularly even distribution of mechanical forces can advantageously be achieved.

If the largest dimension of a majority of the plurality of outer carrier spacer members is substantially equal to a dimension of the antenna carrier member, taken in the direction parallel to the center axis of the patient bore lining, the outer carrier member and the shell member can be supported in their full length and undesired bending in the direction of the center axis of the patient bore lining can be avoided. The phrase "substantially equal to", as used in this application, shall in particular be understood to be equal within a range of 30%, preferably within a range of 20%, and, most preferably, within a range of 10% to both sides of a value or quantity referred to.

In a preferred embodiment of the radio frequency coil, the patient bore lining and the antenna carrier member are substantially made from a fiber-reinforced plastic composite material. The phrase "substantially made from", as used in this application, shall in particular be understood as a portion of equal to or more than 50% by volume, and shall in particular encompass a portion of 100%. In this way, requirements regarding mechanical stability can be fulfilled with low material thickness in radial direction, keeping manufacturing efforts regarding material consumption and costs low.

Preferably, the fiber-reinforced plastic composite material comprises at least one out of glass and carbon as fiber material, and at least one out of epoxy resin and polyester resin as matrix material. In this way, a large variety of suitable materials is readily commercially available which can be selected from.

In one embodiment, also the shell member is substantially made from a fiber-reinforced plastic composite material to achieve a high mechanical stability of the radio frequency coil.

In one embodiment, in which the shell member is substantially made from a fiber-reinforced plastic composite material, the radio frequency screen is fixedly attached to the shell member by being embedded in the fiber-reinforced plastic composite material to achieve a compact design of the radio frequency coil with high mechanical stability.

In a preferred embodiment of the radio frequency coil, at least one of the inner carrier member or the outer carrier member are substantially made from a polymeric foam material. By that, the radio frequency coil can be designed in a particularly lightweight way. Furthermore, due to electromagnetic losses of the polymeric foam material that are low compared to electromagnetic losses of material used in prior art radio frequency coils.

Preferably, the polymeric foam material has a volumetric mass density between 25 kg/m$^3$ and 250 kg/m$^3$. In this range of electric mass density, the polymeric foam material provides sufficient mechanical stability while at the same time enabling a light weight design of the radio frequency coil.

In one embodiment, the polymeric foam material comprises at least one out of polyvinyliden fluoride (PVDF) and polymethacrylimide (PMI).

In yet another preferred embodiment of the radio frequency coil, the at least one radio frequency antenna comprises at least one member made from metal foil, metal mesh or electrically conductive coating that is fixedly attached to the antenna carrier by an adhesive bond. This facilitates the use of readily commercially available and cost-efficient material, so that the radio frequency coil can be designed in a compact and low-cost way.

The same benefit can be achieved if the radio frequency screen includes at least one member made from metal foil, metal mesh or electrically conductive coating that is fixedly attached to the shell member as a carrier by an adhesive bond.

In another aspect of the present invention, a medical modality is provided including at least a magnetic resonance examination system with a main magnet that is configured for generating a static magnetic field $B_0$ at least within a region of an examination space, the medical modality further comprising a radio frequency coil such as disclosed herein. The advantages described for the radio frequency coil in accordance with the invention apply as well to the medical modality.

BRIEF DESCRIPTION OF THE DRAWINGS

These and other aspects of the invention will be apparent from and elucidated with reference to the embodiments described hereinafter. Such embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
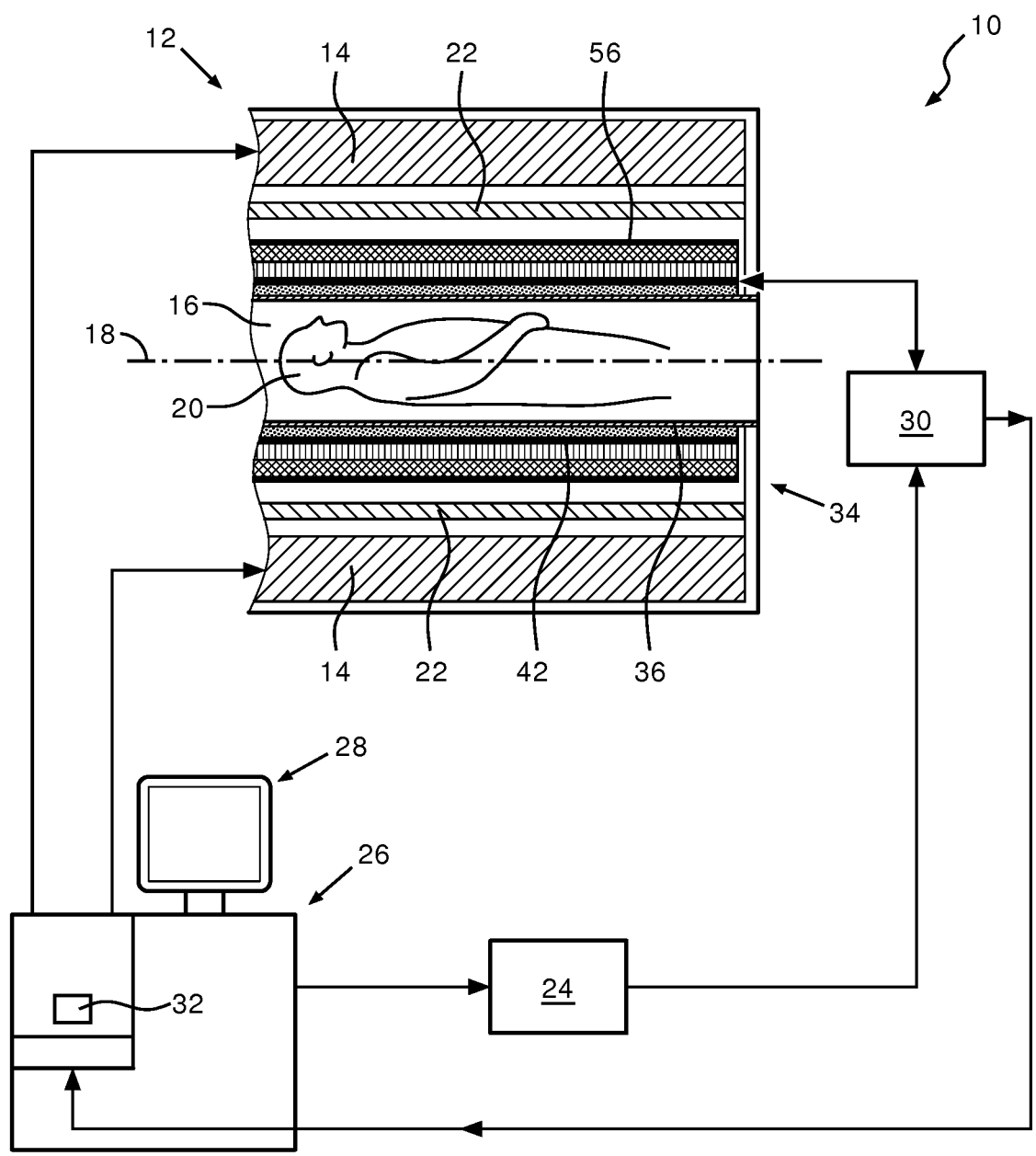
FIG. 1 shows a schematic view of a medical modality including a magnetic resonance examination system with a radio frequency coil in accordance with the invention.

FIG. 1 is a schematic view of a medical modality including a magnetic resonance examination system 10 with a radio frequency coil 34 in accordance with the invention.

The magnetic resonance imaging system 10 is configured for acquisition of magnetic resonance images of at least a portion of a subject of interest 20, usually a patient. To this end, the magnetic resonance imaging system 10 comprises a scanning unit 12 with a main magnet 14 provided for generating a static magnetic field $B_0$. The main magnet 14 has a circular central bore that provides an examination space 16 around a center axis 18 of the main magnet 14 for the subject of interest 20 to be positioned within at least during examination. The main magnet 14 is configured to generate the static magnetic field $B_0$ at least in the examination space 16. The static magnetic field $B_0$ defines an axial direction of the examination space 16, aligned in parallel to the center axis 18 of the main magnet 14.

Although in the following the invention is described to be applied to a bore-type magnetic resonance examination system, it is appreciated that the invention is also applicable to any other type of magnetic resonance examination system providing an examination region within a static magnetic field.

Further, the magnetic resonance imaging system 10 comprises a control unit 26 provided for controlling functions of the magnetic resonance imaging system 10. The control unit 26 comprises a human interface device 28 for displaying and controlling purposes.

The magnetic resonance imaging system 10 further includes a magnetic gradient coil system 22 with magnetic gradient coils provided for generating gradient magnetic fields to be superimposed to the static magnetic field $B_0$. The magnetic gradient coils are concentrically arranged within the bore of the main magnet 14, as is known in the art.

Moreover, the magnetic resonance imaging system 10 includes a radio frequency coil 34 that is designed as a whole-body coil and is arranged within the circular central bore of the main magnet 14 of the magnetic resonance examination system 10.

Figure 2:
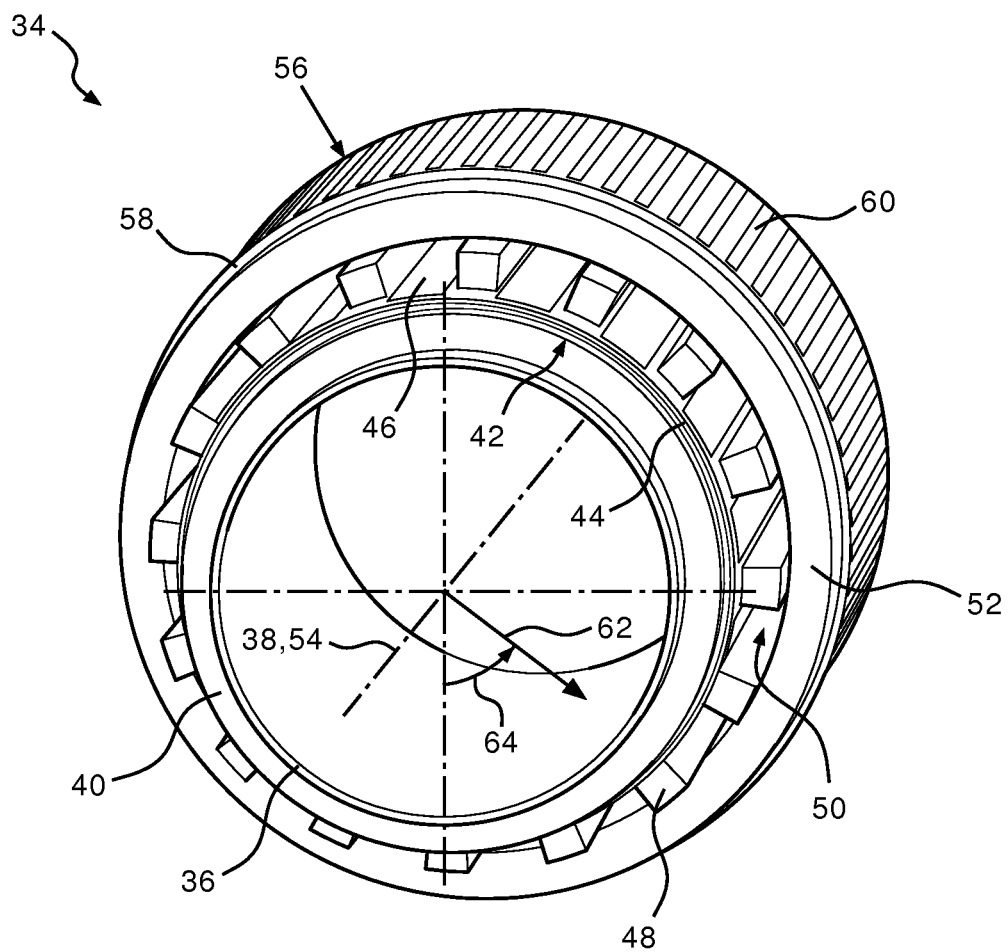
FIG. 2 illustrates a schematic perspective view of the radio frequency coil pursuant to FIG. 1.

A schematic perspective view of the radio frequency coil 34 is given by FIG. 2. In the following, components of the radio frequency coil 34 are described in a sequence according to their radial distance to a center axis 38, starting from the inside.

The radio frequency coil 34 comprises a patient bore lining 36 having the shape of a right hollow cylinder, namely a right circular hollow cylinder, with the center axis 38 that, in an operational state, coincides with the center axis 18 of the main magnet 14. The right circular hollow cylinder is completely made from a fiber-reinforced plastic composite material, which is glass-fiber reinforced epoxy resin (GFRP) having a volumetric mass density of 1900 kg/m³, a Young's modulus of 23000 MPa and a Poisson's ratio of 0.5, and which has a wall thickness of 1.5 mm in a radial direction 62 perpendicular to the center axis 38 of the patient bore lining 36. Suchlike patient bore linings can be manufactured on a mandrel, which results in a high geometric accuracy and which can also allow, depending on an envelope of the mandrel, for an asymmetric radio frequency coil design.

Furthermore, the radio frequency coil 34 comprises an inner carrier member 40. The inner carrier member 40 has a uniform thickness of 10 mm in the radial direction 62 with regard to the center axis 38 of the patient bore lining 36 and is completely made from a commercially available polymeric foam material which comprises polyvinyliden fluoride (PVDF) of a volumetric mass density of 30 kg/m³, a Young's modulus of 0.5 MPa and a Poisson's ratio of 0.33. The inner carrier member 40 is in mechanical contact with a major part of an outwardly directed surface of the patient bore lining 36, and is fixedly attached to the patient bore lining 36 by applying and curing an adhesive to create an adhesive bond between the magnetic bore lining 36 and the inner carrier member 40. The patient bore lining 36 stabilizes the inner carrier member 40 and protects it from being damaged by the subject of interest 20.

Then, the radio frequency coil 34 includes a radio frequency antenna 42 fixedly attached to an antenna carrier member 44, wherein the antenna carrier member 44 is made from GFRP composite material, has a uniform radial thickness of 0.5 mm and is fixedly attached to an outwardly directed surface of the inner carrier member 40 by applying and curing an adhesive to create an adhesive bond between the antenna carrier member 44 and the inner carrier member 40.

In this way, the inner carrier member 40 is sandwiched between the patient bore lining 36 and the antenna carrier member 44 and held in place by adhesive bonds. Alternatively, the starting materials of the polymeric foam material for the inner carrier member 40 may be injected into and let cure in a gap formed by the patient bore lining 36 and the antenna carrier member 44 while these are being firmly held in desired positions.

The radio frequency antenna 42 comprises a plurality of sixteen strip-shaped radio frequency antenna members 46 made from copper foil of 140 µm thickness, which are aligned in parallel to the center axis 38 of the patient bore lining 36, are regularly spaced in an azimuthal direction 64 about the center axis 38 of the patient bore lining 36 and are attached to an outwardly directed surface of the antenna carrier member 44 by an adhesive bond.

The uniform thickness of the inner carrier member 40 of 10 mm in the radial direction 62 creates a safety distance to comply with SAR limits in proximity of the radio frequency antenna members 46. Furthermore, due to the electrical properties of the polymeric foam material, the inner carrier member 40 allows for low electromagnetic losses.

Further towards increasing radial distances to the center axis 38 of the patient bore lining 36, the radio frequency coil 34 comprises a plurality of sixteen identical outer carrier spacer members 48 that have a uniform thickness in the radial direction 62 with regard to the center axis 38 of the patient bore lining 36. The outer carrier spacer members 48 are completely made from the same polymeric foam material as the inner carrier member 40 and are arranged between the strip-shaped radio frequency antenna members 46 on an outwardly directed surface of the antenna carrier member 44.

Along a direction of their largest extension, each one of the outer carrier spacer members 48 has a uniform cross-sectional area shaped as a sector of a circular ring. The outer carrier spacer members 48 are regularly spaced in the azimuthal direction 64 about the center axis 38 of the patient bore lining 36 and are disposed such that the direction of largest extension is arranged in parallel to the center axis 38 of the patient bore lining 36. The largest dimension of each one of the plurality of outer carrier spacer members 48 is substantially equal to a dimension of the antenna carrier member 44 in a direction parallel to the center axis 38 of the patient bore lining 36. In this way, between each of two outer carrier spacer members 48 that are adjacently arranged with regard to the azimuthal direction 64, a free end-to-end space 50 is provided which can beneficially be used for close-by installation of auxiliary electronic components for the radio frequency antenna 42, such as detune circuit boards, capacitors or cables (not shown). The free end-to-end spaces 50 can further be employed as ducts for a controlled flow of cooling air through the radio frequency coil 34. At the same time, the outer carrier spacer members 48 form another layer of a stiffening composite structure of the radio frequency coil 34.

An outer carrier member 52 of the radio frequency coil 34 is arranged outwardly adjacent to the plurality of sixteen outer carrier spacer members 48. The outer carrier member 52 is shaped as a right circular hollow cylinder having a center axis 54 that, in an operational state of the radio frequency coil 34, coincides with the center axis 38 of the patient bore lining 36.

The outer carrier member 52 has a uniform thickness of 8 mm in the radial direction 62 with regard to the center axis 38 of the patient bore lining 36 and is completely made from a commercially available polymeric foam material which comprises polymethacrylimide (PMI) of a volumetric mass density of about 50 kg/m$^3$ and a Young's modulus of 0.7 MPa. The outer carrier member 52 is in mechanical contact with a major part of a total area of outwardly directed surfaces of the outer carrier spacer members 48.

Finally, the radio frequency coil 34 comprises a radio frequency screen 56 that is fixedly attached to the shell member 58 by an adhesive bond, the shell member 58 serving as a carrier for the radio frequency screen 56, wherein the shell member 58 is made from GFRP composite material, has a uniform radial thickness of 1.0 mm and is in mechanical contact with an outwardly directed surface of the outer carrier member 52. In this way, the shell member 58 provides additional mechanical stability to the radio frequency coil 34. The radio frequency screen 56 comprises a plurality of radio frequency screen members 60 formed as copper foil strips of 70 μm thickness. The copper foil strips are regularly spaced in the azimuthal direction 64 about the center axis 38 of the patient bore lining 36 to prevent a generation of eddy currents, and are arranged with their direction of largest extension in parallel to the center axis 38 of the patient bore lining 36.

The outer carrier member 52 creates additional distance between the radio frequency antenna 42 and the radio frequency screen 56, and at the same time provides mechanical support for the radio frequency screen 56.

The inner carrier member 40, the plurality of outer carrier spacer members 48 and the outer carrier member 52 create the necessary space between the various layers while keeping the weight and electromagnetic losses of the radio frequency coil 34 low. The layered construction concept requires minimal machining and makes use of standard materials. The overall sandwich structure comprising different polymeric foam material and GFRP layers finally leads to a very rigid and durable device, which further provides the benefit of a reduced acoustic noise level.

As an additional option (not shown), stiffening rings can be integrated at ends of the hollow cylinders to create a mechanical mounting interface to the balance of the magnetic resonance examination system 10.

As another additional option (not shown), a detachable fixation between the outer carrier spacer members 48 and the outer carrier member 52 would allow for easy access for maintenance of the radio frequency antenna 42 and/or the auxiliary electronic components. The detachable fixation may be established via axial key and slot joints or by any other fixation members that appear to be suitable to those skilled in the art.

Referring again to FIG. 1, the radio frequency antenna 42 is provided for applying a radio frequency magnetic field $B_1$ to the examination space 16 during radio frequency transmit phases to excite nuclei of or within the subject of interest 20. The radio frequency coil 34 is also configured for receiving magnetic resonance signals during radio frequency receive phases from the nuclei of or within the portion of the subject of interest 20 that have been excited by applying the radio frequency excitation field $B_1$. In an operational state of the magnetic resonance imaging system 10, radio frequency transmit phases and radio frequency receive phases are taking place in a consecutive manner.

Furthermore, the magnetic resonance imaging system 10 includes a radio frequency transmitter unit 24 that is connected to and controlled by the control unit 26. The radio frequency transmitter unit 24 is provided to feed radio frequency power of a magnetic resonance radio frequency to the radio frequency antenna 42 of the radio frequency coil 34 via a radio frequency switching unit 30 during the radio frequency transmit phases. During radio frequency receive phases, the radio frequency switching unit 30 directs the magnetic resonance signals from the radio frequency antenna 42 of the radio frequency coil 34 to a signal processing unit 32 residing in the control unit 26. The signal processing unit 32 is configured for processing acquired magnetic resonance signals to generate scanning images represented by magnetic resonance images of the portion of the subject of interest 20 from the acquired scanning data represented by the magnetic resonance signals.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 10 magnetic resonance examination system
12 scanning unit
14 main magnet
16 examination space
18 center axis
20 subject of interest
22 magnetic gradient coil system
24 radio frequency transmitter unit
26 control unit
28 human interface devices
30 radio frequency switching unit
32 signal processing unit
34 radio frequency coil
36 patient bore lining
38 center axis
40 inner carrier member
42 radio frequency antenna
44 antenna carrier member
46 radio frequency antenna member
48 outer carrier spacer member
50 end-to-end space
52 outer carrier member
54 center axis
56 radio frequency screen
58 shell member
60 radio frequency screen member
62 radial direction
64 azimuthal direction

The invention claimed is:

1. A radio frequency coil for use in a medical modality including at least a magnetic resonance examination system, and configured for being arranged within an examination space of the magnetic resonance examination system, wherein a main magnet is configured for generating a static magnetic field B0 at least within the examination space, the radio frequency coil comprising:
 a patient bore lining having a shape of a right hollow cylinder with a center axis and comprising a single layer arranged around the center axis as an inner lining of the radio frequency coil around the center axis;
 an inner carrier member that is in mechanical contact with at least a major part of an outwardly directed surface of the single layer of the patient bore lining and is fixedly attached to the patient bore lining;
 at least one radio frequency antenna fixedly attached to an antenna carrier member, wherein the antenna carrier member is made from a composite material, and is fixedly attached to an outwardly directed surface of the inner carrier member;
 at least one outer carrier spacer member that is arranged on at least one of the at least one radio frequency antenna or an outwardly directed surface of the antenna carrier member, wherein the at least one outer carrier spacer member provides a free end-to-end space in a direction parallel to the center axis;
 an outer carrier member substantially made from polymeric foam and shaped as a right hollow cylinder having a center axis, which in an operational state is arranged in parallel to the center axis of the patient bore lining, and that is in mechanical contact with at least a major part of a total area of outwardly directed surfaces of the at least one outer carrier spacer member; and
 a shell member that is in mechanical contact with at least a major part of an outwardly directed surface of the outer carrier member and comprising a single layer arranged around the center axis and spaces apart from the patient bore lining throughout.

2. The radio frequency coil as claimed in claim 1, wherein each one of the inner carrier member, the at least one outer carrier spacer member and the outer carrier member has a uniform thickness in a radial direction with regard to the center axis of the patient bore lining.

3. The radio frequency coil as claimed in claim 1, wherein, in the operational state, at least the center axis of the patient bore lining and the center axis of the outer carrier member coincide.

4. The radio frequency coil as claimed in claim 1, further comprising a radio frequency screen that is fixedly attached to the shell member serving as a carrier.

5. The radio frequency coil as claimed in claim 1, further comprising a plurality of outer carrier spacer member, wherein at least two of the outer carrier spacer members are spaced in an azimuthal direction about the center axis of the patient bore lining to provide the free end-to-end space.

6. The radio frequency coil as claimed in claim 5, wherein each outer carrier spacer member of the plurality of outer carrier spacer members is disposed in such a way that a direction of largest extension is arranged in parallel to the center axis of the patient bore lining.

7. The radio frequency coil as claimed in claim 5, wherein a largest dimension of a majority of the plurality of outer carrier spacer members is substantially equal to a dimension of the antenna carrier member, taken in a direction parallel to the center axis of the patient bore lining.

8. The radio frequency coil as claimed in claim 1, wherein the patient bore lining and the antenna carrier member are substantially made from a fiber-reinforced plastic composite material.

9. The radio frequency coil as claimed in claim 8, wherein the fiber-reinforced plastic composite material comprises at least one out of glass and carbon as fiber material, and at least one out of epoxy resin and polyester resin as matrix material.

10. The radio frequency coil as claimed in claim 1, wherein the inner carrier member is substantially made from a polymeric foam material.

11. The radio frequency coil as claimed in claim 10, wherein the polymeric foam material has a volumetric mass density between 25 kg/m$^3$ and 250 kg/m$^3$.

12. The radio frequency coil as claimed in claim 10, wherein the polymeric foam material comprises at least one out of polyvinyliden fluoride and polymethacrylimide.

13. The radio frequency coil as claimed in claim 1, wherein the at least one radio frequency antenna comprises at least one member made from metal foil, metal mesh or electrically conductive coating that is fixedly attached to the antenna carrier member by an adhesive bond.

14. A medical modality including at least a magnetic resonance examination system with a main magnet that is configured for generating a static magnetic field B0 at least within an examination space, the medical modality further comprising a radio frequency coil as claimed in claim 1.

15. A radio frequency coil for use in a medical modality including at least a magnetic resonance examination system, the radio frequency coil comprising:
- a patient bore lining having a shape of a right hollow cylinder with a center axis and comprising a single layer arranged around the center axis as an inner lining of the radio frequency coil around the center axis;
- an inner carrier member that is in mechanical contact with an outwardly directed surface of the single layer of the patient bore lining and is fixedly attached to the patient bore lining;
- at least one radio frequency antenna fixedly attached to an antenna carrier member, wherein the antenna carrier member is fixedly attached to an outwardly directed surface of the inner carrier member;
- at least one outer carrier spacer member that is arranged on at least one of the at least one radio frequency antenna or an outwardly directed surface of the antenna carrier member, wherein the at least one outer carrier spacer member provides a free end-to-end space in a direction parallel to the center axis;
- an outer carrier member shaped as a right hollow cylinder having a center axis, which in an operational state is arranged in parallel to the center axis of the patient bore lining, and that is in mechanical contact with outwardly directed surfaces of the at least one outer carrier spacer member; and
- a shell member that is in mechanical contact with an outwardly directed surface of the outer carrier member and comprising a single layer arranged around the center axis and spaces apart from the patient bore lining throughout.

16. The radio frequency coil of claim 15, wherein each one of the inner carrier member, the at least one outer carrier spacer member and the outer carrier member has a uniform thickness in a radial direction with regard to the center axis of the patient bore lining.

17. The radio frequency coil of claim 15, further comprising a radio frequency screen that is fixedly attached to the shell member serving as a carrier.

18. The radio frequency coil of claim 15, further comprising a plurality of outer carrier spacer member, wherein at least two of the outer carrier spacer members are spaced in an azimuthal direction about the center axis of the patient bore lining to provide the free end-to-end space.

19. The radio frequency coil of claim 15, wherein each outer carrier spacer member of the at least one outer carrier spacer members is disposed in such a way that a direction of largest extension is arranged in parallel to the center axis of the patient bore lining.

20. The radio frequency coil of claim 19, wherein a largest dimension of a majority of the at least one outer carrier spacer member is substantially equal to a dimension of the antenna carrier member, taken in a direction parallel to the center axis of the patient bore lining.

* * * * *